US 6,737,580 B2

(12) United States Patent
Eaton et al.

(10) Patent No.: US 6,737,580 B2
(45) Date of Patent: May 18, 2004

(54) CONTROL SENSOR HOUSING WITH PROTECTIVE LAMINATE

(75) Inventors: William Eaton, Brooklyn Park, MN (US); Roger J. Saba, Champlin, MN (US)

(73) Assignee: Turck Inc., Plymouth, MN (US)

( * ) Notice: Subject to any disclaimer, the term of this patent is extended or adjusted under 35 U.S.C. 154(b) by 144 days.

(21) Appl. No.: 10/033,413

(22) Filed: Dec. 28, 2001

(65) Prior Publication Data

US 2003/0123242 A1 Jul. 3, 2003

(51) Int. Cl.[7] .................................................. H05K 5/06
(52) U.S. Cl. ....................... 174/52.3; 73/493; 73/514.16
(58) Field of Search ........................... 174/52.3, 35 R; 73/493, 516; 257/680

(56) References Cited

U.S. PATENT DOCUMENTS 5,554,806 A * 9/1996 Mizuno et al. ............... 73/493
5,901,046 A * 5/1999 Ohta et al. ................... 361/760
6,603,183 B1 * 8/2003 Hoffman ...................... 257/434
2003/0159844 A1 * 8/2003 Wolf et al. ................. 174/35 R

* cited by examiner

Primary Examiner—Hung V. Ngo
(74) Attorney, Agent, or Firm—Moore, Hansen & Sumner

(57) ABSTRACT

A housing for protectively shielding control sensors detectors, or similar devices from harsh work environments. The housing comprises an enclosure having a sensing area transparent to electromagnetic waves. The sensing area is protected by a material that is arranged in an overlaying relation thereto, and which is of sufficient thickness to effectively protect the sensing area of the housing from harsh work environments while allowing the control sensor to operate therethrough in a normal fashion. The protective material may take the form of a laminate applied to a cap covering the sensing area, or the cap itself and/or housing may be made from the protective material. Preferably, the protective material includes material having a low coefficient of friction such as molybdenum disulfide, graphite, or polytetrafluoroethylene.

23 Claims, 1 Drawing Sheet

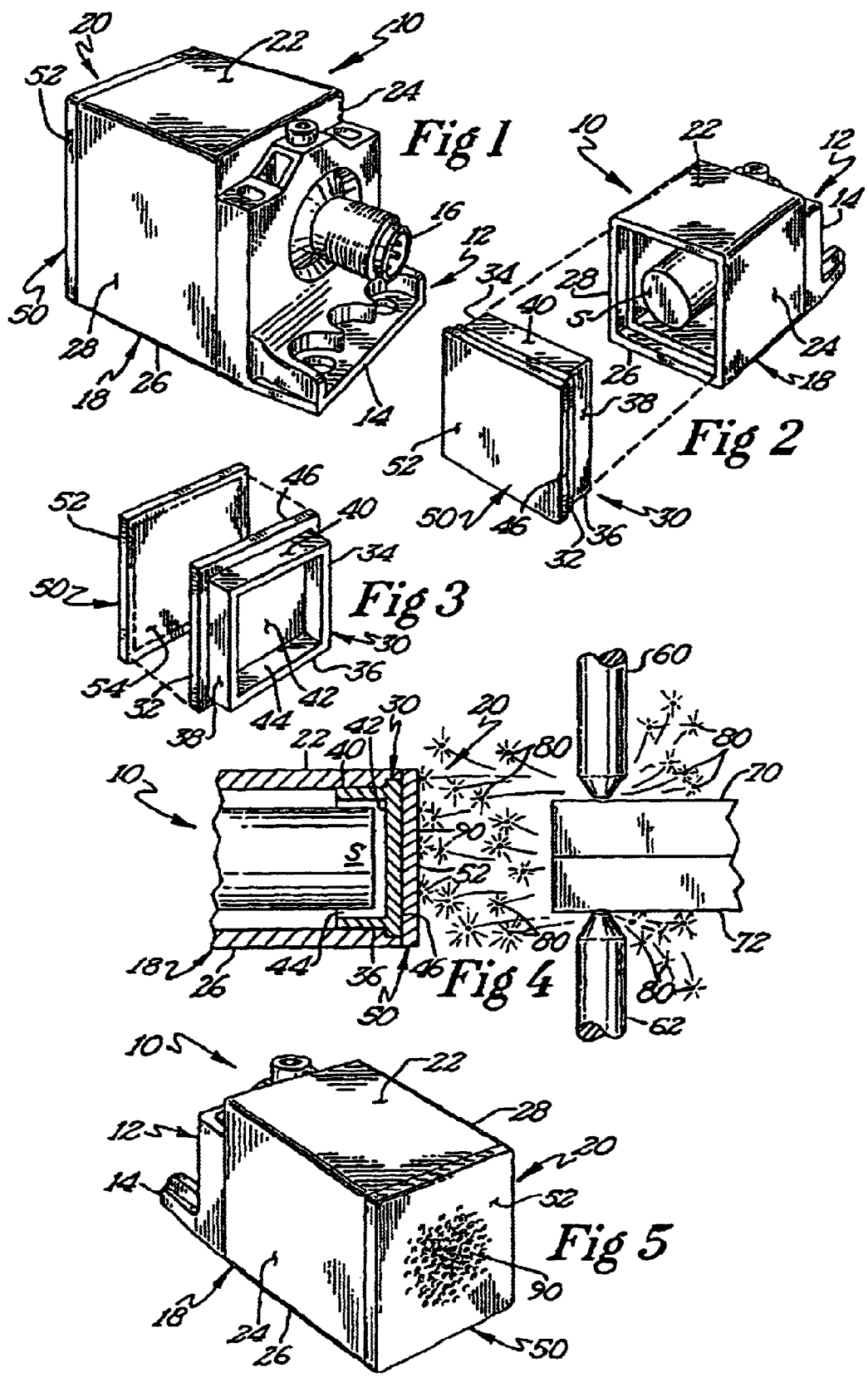

CONTROL SENSOR HOUSING WITH PROTECTIVE LAMINATE

BACKGROUND OF THE INVENTION

This invention relates generally to protective housings for control sensors used in harsh operating conditions. More particularly, the present invention relates to a control sensor housing having an exterior surface that is provided with a laminate that is resistant to weld flash, high temperatures, pitting, abrasion, acidic and caustic solutions, solvents, and the like.

Robotics and automation have been used in manufacturing for many years. A typical use for robotics and automation is in the automotive industry, and particularly in operations such as car body assembly. In such an operations, welding instead of bolting or riveting is the preferred method of joining car body parts together. This produces consistent, predictable results and the assembled car bodies are not only stronger and better able to resist vibrations. they are less likely to develop squeaks and rattles as they age. Car body fabrication generally involves moving a chassis or platform along an assembly line past a series of welding stations that join car body components such as door pillars, firewalls and floor pans together at predetermined weld locations on the chassis. Since the car body components are not all the same size and shape, it will be appreciated that different types of welds may be required. For instance, a door pillar may require one type of weld, a firewall may require another type of weld, and a floor pan may require yet another type of weld. And, since welding units are somewhat specialized, each welding station is often equipped with a plurality of different welding set-ups, so that a welding station may be equipped with stationary or mobile spot welding units that are used to join pieces of sheet metal together. Or, the welding station may include stationary or mobile units equipped for welding thick frame members together with a single bead.

It will be appreciated that it is not uncommon to fabricate different models or makes of vehicles at a single plant. That is, a particular car may be available as a coupe, a sedan, or a convertible. Or, a plant may be used to fabricate different makes of cars within a family of cars. In situations like this, welding requirements will vary between vehicle models and makes, and welding stations may be provided with extra welding units.

In such aforementioned welding units, welding operations are often partially controlled by sensors that detect the presence or absence of a work piece at a particular, predetermined location, or which monitor and control robotic units as they traverse along predetermined paths of motion. Such sensors are available in a wide variety of shapes and sizes and are usually referred to generically as proximity detectors. Because of the harsh work environment inherent to welding stations, such sensors are usually provided with protective housings. Usually, at least one wall of the protective housing is composed of a non-metallic material such as glass reinforced thermoplastics or thermoset plastics against which the working end of the sensor is positioned and through which the sensor may operate. Such housings are also typically provided with brackets and fittings that allow the housing and sensor to be operatively connected to supports and other electrical components, respectively. In use, these protected sensors are usually positioned near the welding electrodes or rods so that they are better able to determine when a work piece and/or welding electrode or rod is in the correct position for welding. As one might expect, the closer a sensor is positioned to a welding electrode or rod, the more apt it is to be exposed to weld flash and high temperatures.

Additionally, sensors may be subject to accidental impacts from a variety of sources, inadvertent contact with corrosive chemicals, or temperature extremes, all of which may shorten the operational life of the sensors. For example, a sensor may be impacted and scratched by machinery that has become broken, bent or misaligned. Or a sensor might become inoperable due to contact with highly reactive materials used during fabrication, or corrosive chemicals used during periodic cleaning. Or the sensor might be exposed to ambient temperatures in excess of its designed operational range.

Of the aforementioned operational conditions, weld flash is of the greatest concern because it cannot be easily ameliorated or eliminated. Weld flash occurs during the welding operation and comprises small bullet-like projectiles of molten weld material that are randomly ejected from the weld site by minute impurities in the weld material as they are consumed by the heat generated by the welding electrodes or rods. These hot projectiles can vary in size from 5 to over 200 mg, have speeds of over 11 meters per second, and have kinetic energies of over $2.3 \times 10^{-3}$ joules. Most of the projectiles are ejected radially from the weld site in a weld flash zone that is determined largely by the configuration of the parts being welded and the operational characteristics of the welding unit itself. Unfortunately, for optimum operation, the sensor(s) usually are required to be positioned within this weld flash zone. While the odds of a sensor being impacted by weld flash are fairly low compared to the total area of the weld flash zone, one has to remember that robotic welders will perform a particular weld or welds hundreds if not thousands of times a day; day after day. Thus, over time, even a sensor having a small surface area will be impacted by a significant amount of weld flash. Of equal importance is the fact that due to the configuration and arrangement of the welding units at any given welding station, it is not uncommon for weld zones of the weld units to overlap. Thus, a sensor could be subjected to hot projectiles from a plurality of different sources.

Weld flash is particularly troublesome because the destructive effect it has on the non-metallic sensing surfaces of the sensor housings. When weld flash material impacts a typical housing sensing surface comprised of glass reinforced thermoplastic or thermoset plastic, it may bounce off harmlessly, but more often than not it forms a pit or becomes embedded in the material. As one may appreciate, pitting and embedding form surface irregularities that increase the surface area of the housing sensing surface upon which successive bits of weld flash may more easily adhere. Over time, weld flash will often form an accumulation or accretion on the sensing surface of the housing. And, because this accretion is primarily metallic, it affects the operation of the sensor (which is usually designed to sense metallic objects). That is, the flash may accumulate to the extent where it becomes detectable and it combines with the material to be welded to trigger the sensor prematurely. Or, the flash may accumulate to the extent where it effectively operates as the material to be welded and the sensor is continuously triggered.

Thus, the sensors must be continually inspected and tested for the effects of weld flash, or alternatively, be periodically replaced according to a predetermined schedule. In either case, the fact remains that sensors used in the above-mentioned working conditions will ultimately require replacement—in as little as 500 weld cycles per welding unit. And each time a sensor has to be replaced, the assembly line must be shut down for servicing. One can appreciate the magnitude of the problem this creates when one considers that there may be a plurality of assembly lines, and each assembly line may have a plurality of welding stations, and each of these welding stations may have a plurality of sensors, and each sensor is subject to the effects of weld flash damage and high temperature. And as one may imagine, replacing such sensors can result in significant down time.

Initially, thermoplastic materials such as glass filled nylon 6 and glass filled nylon 6.6 were used for the non-metallic sensing surfaces of sensor housings. With this type of material, small bits of slow moving weld flash having low levels of kinetic energy were able to bounce off, due to the material's somewhat resilient nature. However, because of the thermoplastic's relatively low glass transition and melting points, they were susceptible to impacts by the larger bits of hot weld flash having higher levels of kinetic energy, which formed pits primarily by melting the material. In an effort to reduce pitting, thermoset materials were tried. Because thermoset plastic materials have relatively higher glass transition and melting points, they were better able to resist pitting caused by hot weld material and higher temperatures. However, they were comparatively more brittle than the thermoplastics and were susceptible to pitting due to impacts of weld flash that knocked off fragments of the material. Thus, accretions of weld flash were able to form on both types of materials.

In an effort to minimize and/or reduce the effect of weld flash on non-metallic sensing surfaces, other materials such as Kevlar® and ceramics have been tried. However, these materials suffer from the same drawbacks as the above-mentioned thermoplastics and thermoset plastics. That is, they are either too soft or too hard and do not solve the problems associated with weld flash, namely the accretion of weld material on the sensing surface of the housing.

There is a need for a housing for a control sensor that is able to withstand weld flash, abrasion, impacts, and high temperatures. There is also a need for a housing for a control sensor that may be fabricated inexpensively and quickly using known techniques and technologies.

BRIEF SUMMARY OF THE INVENTION

The present invention comprises a housing for a control sensor. The housing has an attachment end, a body and a sensing end. The sensing end includes a cap that, with the body and the attachment end, forms an enclosure. A control sensor, detector, or similar device is positioned within the enclosure and arranged so that it is able to operate through an end wall of the cap in a normal fashion. Preferably, the end wall of the cap comprises thermoplastic or thermoset plastic, although any material that allows electromagnetic waves to pass therethrough in sufficient strength to be able to be detected by a sensor may be used. Preferably, the end wall of the end cap comprises glass filled nylon 6.6, nylon 6, thermoset plastic X655 (manufactured by Vyncolit N. V., Ghent, Belgium), polyvinylidene fluoride (PVDF), or like material. The end wall of the cap has an outer surface that is provided with a laminate of material that also allows transmission of electromagnetic waves therethrough. The laminate provides the end wall of the cap with protection against harsh environments, and in particular against the effects associated with weld flash. Of the various types of laminates that have been tried, it has been discovered that laminates that contain material having low coefficients of friction work better than other laminates with relatively higher coefficients of friction. And of those materials, the best results have been obtained with materials such as molybdenum disulfide, graphite, and polytetrafluoroethylene, either singly or in combination with each other, and preferably dispersed in a mixture of resinous matrix. These mixtures are usually combined with an evaporative carrier that allows the mixture to be applied in liquid form and are commonly available as dry-film lubricants.

It has been found that dry-film lubricants instead of conventional laminated materials are particularly suited for this type of application not only because they are able to resist the high temperatures of weld flash, but also because they are able to resist the pressures generated by weld flash impacts. And, because dry-film lubricants are applied in relatively thin layers, they are able to utilize the inherent resiliency of the underlying support material and cushion the impacts of the weld flash. Moreover, the plate-like structure of some of the lubricants, notably graphite, appears to facilitate "self healing." A dry-film lubricant that is particularly suitable for use as a protective laminate for sensor control housings is Everlube® 10026, manufactured and sold by E/M Engineered Coating Solutions, 100 Cooper Circle, P.O. Box 3969, Peachtree City, Ga. 30269. It is understood, however, that other dry-film lubricants having the same properties may be used.

An object of the present invention is to provide a control sensor housing that is able to resist harsh work environments.

It is another object of the present invention to increase the operational life of a control sensor.

A feature of the present invention is that a control sensor housing may be toughened using known technologies and techniques.

Another feature of the present invention is that toughness may be imparted to a non-conductive surface of a control sensor housing by utilizing a protective material.

An advantage of the present the invention is that the protective material may take the form of a laminate that can be operatively attached to a wide variety of materials.

Additional objects, advantages and features of the invention will be set forth in part in the description which follows, and in part will become apparent to those skilled in the art upon examination of the following or may be learned by practice of the invention. The objects and advantages of the invention may be realized and attained by means of the instrumentalities and combination particularly pointed out in the appended claims.

BRIEF DESCRIPTION OF THE DRAWINGS

FIG. 1 is a perspective view of a preferred embodiment of a housing of the present invention;

FIG. 2 is an exploded, perspective view of FIG. 1 illustrating the components of the housing and the position of a sensor contained therein;

FIG. 3 is a partial, exploded, perspective view of the sensing area and laminate of the housing of FIG. 1;

FIG. 4 is a partial, cross-sectional view of a preferred embodiment showing a housing with a sensor positioned therein, and a welding unit in spaced relation from each other; and, FIG. 5 is a perspective view of a preferred embodiment of a housing of the present invention showing an accretion of weld flash on a sensing surface of the housing.

DESCRIPTION OF THE PREFERRED EMBODIMENTS

Referring to FIG. 1, a preferred embodiment of a control sensor housing is depicted. This housing 10 includes an attachment end 12 a body 18 and a sensing end 20. The attachment end 12 includes an attachment bracket 14 and an electrical fitting 16 that are used to operatively connect the housing to a support and electrical components, respectively. The body 18 of this preferred embodiment includes four walls 22, 24, 26, and 28 (see also, FIG. 2) that form an enclosure into which a control sensor "S" is positioned. The sensing end 20 of the housing, as depicted, includes a sensing surface 52 which will be discussed below in greater detail.

It should be understood that while the preferred embodiment of the housing is depicted as being substantially cubical, other configurations are possible, for example, barrel shaped, cylindrical or rectangular. Moreover, it should also be understood that the location of the sensing end could be oriented in a different direction, relative to the attachment bracket. Thus, the sensing end could be located at side 22, for example.

Referring now to FIG. 2, the housing 10 has been partially disassembled so that the components may be more easily identified and described. As depicted, the sensing end 20 of the housing 10 includes a cap 30 having an end wall 32 with an outer surface 46 onto which a laminate 50 has been operatively attached. The cap 30 includes sides 34, 36, 38 and 40 (see also, FIG. 3) which are arranged and configured to so that they are adjacent sides 24, 26, 28 and 22, respectively, and lie in the interior of body 18 in a nesting relation.

Referring to FIG. 3, the sides 34, 36, 38 and 40 along with the inner surface 42 of the cap 30 define a cavity 44 into which a portion of the sensor "S" may extend. As can be seen, the laminate 50 has a slightly larger surface area than the end cap 32. This allows the laminate to also cover the ends of walls 22, 24, 26, and 28 so that a continuous, unbroken layer covers the entire sensing area 20 of the housing 10 (see, FIG. 4). As mentioned above, the laminate 50 includes material that has a low coefficient of friction, such as molybdenum disulfide, graphite, or polytetrafluoroethylene that is dispersed either singly or in combination with each other in a resinous substrate. And, such materials are most often found in dry-film lubricants such as Everlube® 10026. It will be appreciated that dry-film lubricants are most often applied in spray form and usually in thicknesses of around 1–10 mils. Thus, it should be apparent that the laminate 50 as depicted FIGS. 2, 3 and 4 is not to scale. Rather the laminate, as depicted, is exaggerated to facilitate a clearer understanding of the invention.

In this preferred embodiment, the laminate 50 is applied to the outer surface 46 of the end wall 32 of cap 30 in spray form and allowed to cure thereon at ambient temperature for about seventy-two hours. In order to promote a better interface between the outer surface 46 of the end wall 32 and the inner surface 54 of the laminate, it may be necessary to roughen or otherwise texture the outer surface 46 of the end wall 32. This may be done by mechanically working the outer surface 46, preferably by bead blasting. After the outer surface 46 of the end wall 32 of the cap 30 has been worked, it may be further prepared to remove any extraneous matter that may interfere with proper adhesion. The laminate material is then applied, preferably in spray form. As mentioned above, the thickness of the laminate is about 1–10 mils. However, the more desired thickness is in the range of 2–7 mils and more preferably 2–4 mils. It will be appreciated that precise thickness of a laminate may be achieved by applying the material in several thin layers rather than one thick layer. And, while the preferred method of applying the laminate is by spraying, it is understood that the laminate material may be applied by other conventional methods, such as dipping or brushing or tumbling. Alternatively, it is envisioned that the laminate be formed as a sheet of material that may be adhesively or otherwise attached to the outer surface 46 of the end wall 32. It is also envisioned that the cap 30 and attached laminate 50 be removably and interchangeably attached to the body 18 of the housing 10.

Referring now to FIG. 4, a partial, sectional view of the housing is shown as it may be used in conjunction with a welding unit. In this preferred embodiment, the sensor "S" is an inductive proximity detector and it is oriented so that its sensing end is adjacent inner surface 42 of the end wall 32 of the cap 30. From this position, the sensor "S" is able to detect when the work pieces 70, 72 are in the correct position for welding. Although the preferred embodiment of the control sensor "S" is an inductive proximity detector, it should be apparent that other detectors and sensors that utilize electromagnetic waves may be used, for example, infrared, magnetic, VHF, UHF, radio, etc.

Note, in this figure, that the housing 10 is positioned so that the sensing surface 52 is in the center of the weld zone where most of the weld flash 80 is likely to be produced. It is understood, however, that the housing 10 and sensing surface 52 need not directly face the welding unit. For instance, the sensing surface 52 may be angled or parallel with respect to the work pieces 70, 72 (not shown). Or, the housing 10 and sensing surface 52 may be positioned to the right of the welding electrodes 60, 62 (not shown). It is also understood that there may be more than one sensor at a particular welding unit to enable, for example, the location of a plurality of work pieces to be monitored (not shown).

Because only the sensing area 20 need be transparent to electromagnetic waves, it is often desirable to fabricate the remainder of the housing from other, more durable material. Thus, it will be appreciated that the side walls 22, 26 of the body 18 are depicted in cross-section as being metallic material. Some of the more desirable materials for housing bodies include anodized aluminum and stainless steel, but other similar material could be used.

The partial welding unit depicted in the figure is a spot welding unit of the type having opposing electrodes 60, 62 that simultaneously clamp work pieces 70, 72 together and pass a high electrical current therebetween. As mentioned above, during the welding process, bits of hot weld material, known as weld flash 80, are ejected from the weld site. As depicted, the weld zone for the partial spot welding unit is primarily to the left of the weld site. It will be appreciated, however, that different welding set-ups will have different weld flash zones. For example, a welding rod that is used to join thick pieces of metal together will have a differently shaped weld zone (not shown).

Referring now to FIG. 5, a housing 10 that does not have the aforementioned protective laminate is depicted. As can be seen, an accumulation or accretion 90 of weld flash 80 is depicted in the center of the sensing surface 52. It should be understood, however, that accretions such as the one depicted may form over the entire sensing surface in a more or less even pattern, or in concentrations that are off-center.

The present invention having thus been described, other modifications, alterations or substitutions may present themselves to those skilled in the art, all of which are within the spirit and scope of the present invention. For example, it is envisioned that the sensor cap 30 or the entire sensor housing 10 and cap 30 assembly could be formed from a material which is resistant to weld flash and has the requisite toughness. It is therefore intended that the present invention be limited in scope only by the claims attached below:

What is claimed is:

1. A housing for protectively shielding a control sensor from harsh work environments, the housing comprising an enclosure having a sensing area that is transparent to electromagnetic waves, and a laminate, the laminate operatively attached to the sensing area of the housing in an overlaying relation, the laminate having sufficient thickness to effectively protect the sensing area from harsh work environments while allowing a control sensor to operate therethrough in a normal fashion.

2. The housing of claim 1, wherein the sensing area is comprised of a non-metallic material.

3. The housing of claim 2, wherein the non-metallic material is selected from the group consisting of thermoplastic and thermoset materials.

4. The housing of claim 2, wherein the non-metallic material is nylon.

5. The housing of claim 2, wherein the non-metallic material is polyvinylidene fluoride.

6. The housing of claim 1, wherein the laminate comprises molybdenum disulfide.

7. The housing of claim 1, wherein the laminate comprises graphite.

8. The housing of claim 1, wherein the laminate comprises polytetrafluoroethylene.

9. The housing of claim 1, wherein the laminate is a dry film lubricant.

10. The housing of claim 1, wherein the laminate is about 1 to 20 mils thick.

11. The housing of claim 1, wherein the laminate is about 1–8 mils thick.

12. The housing of claim 6, wherein the control sensor is a proximity detector.

13. The housing of claim 12, wherein the laminate further comprises graphite.

14. The housing of claim 1, wherein the laminate further comprises polytetrafluoroethylene.

15. The housing of claim 6, wherein the laminate comprises Everlube® 10026.

16. The combination of a housing and a proximity detector, the housing comprising an enclosure configured and arranged to receive a proximity detector positioned therein, the enclosure having a sensing area that is transparent to electromagnetic waves, and a laminate, the laminate operatively attached to the sensing area in an overlaying relation, the laminate having sufficient thickness to effectively protect the sensing area of the housing from harsh work environments while allowing the proximity detector to operate therethrough in a normal fashion.

17. The combination of claim 16, wherein the laminate includes molybdenum disulfide.

18. The housing of claim 16, wherein the laminate includes graphite.

19. The housing of claim 16, wherein the laminate includes polytetrafluoroethylene.

20. The housing of claim 16, wherein the laminate is a dry film lubricant.

21. The housing of claim 16, wherein the laminate is about 1 to 20 mils thick.

22. The housing of claim 16, wherein the laminate is about 1–8 mils thick.

23. The housing of claim 16, wherein the laminate is substantially the same size as the sensing area of the housing.

* * * * *